United States Patent
Matsuo et al.

[11] Patent Number: 5,674,659
[45] Date of Patent: Oct. 7, 1997

[54] ELECTRODEPOSITION RESIST FILM DRYING METHOD

[75] Inventors: Seiichi Matsuo, Osaka; Kouichi Nagata, Neyagawa; Shigeharu Tanaka, Kyoto; Makoto Shimizu, Osaka, all of Japan

[73] Assignee: Nippon Paint Co., Ltd., Osaka, Japan

[21] Appl. No.: 307,764

[22] PCT Filed: Jan. 27, 1994

[86] PCT No.: PCT/JP94/00105

§ 371 Date: Sep. 27, 1994

§ 102(e) Date: Sep. 27, 1994

[87] PCT Pub. No.: WO94/17648

PCT Pub. Date: Aug. 4, 1994

[30] Foreign Application Priority Data

Jan. 28, 1993 [JP] Japan ................... 5-012447

[51] Int. Cl.⁶ .................. G03F 7/16; B05D 3/12
[52] U.S. Cl. .............. 430/270.1; 430/330; 156/150; 156/151; 427/365; 427/366
[58] Field of Search ................. 430/259, 311, 430/330, 270.1; 156/150, 151; 427/365, 366

[56] References Cited

U.S. PATENT DOCUMENTS

5,037,504   8/1991   Takeuchi et al. ............ 156/151

FOREIGN PATENT DOCUMENTS

| 0431701 | 6/1991 | European Pat. Off. . |
|---|---|---|
| 2-42446 | 2/1990 | Japan . |
| 3-177586 | 8/1991 | Japan . |
| 4-155884 | 5/1992 | Japan . |

OTHER PUBLICATIONS

Takao Hashimoto, "Illustrated Explanation of Photofabrication", Issued by Sougou Denshi Shuppan, Jul. 10, 1986.

Patent Abstracts of Japan, vol. 16, No. 444 (E-1265) Sep. 16, 1992 & JP-A-04 155 884 (Hitachi) May 28, 1992.

Database WPI, Week 7547, Derwent Publications Ltd., London, GB; AN 75-77631W&JP-A-50 041 937 (Toa Synthetic Chem) Apr. 16, 1975.

*Primary Examiner*—John S. Chu
*Attorney, Agent, or Firm*—Wenderoth, Lind & Ponack

[57] ABSTRACT

Provided is a method for producing a photoresist film for use in producing a a precision fine process component capable of achieving removal of moisture component and film formation by heating in a short time, forming a resist film having a resolution much finer than that of the conventional method, and easily drying a thin board. The resist film obtained through the electrodeposition coating process is roll-pressed by pressure rolls with heat applied to the film.

8 Claims, 3 Drawing Sheets

ELECTRODEPOSITION RESIST FILM DRYING METHOD

TECHNICAL FIELD

The present invention relates to a method for producing a photoresist film for use in producing a precision fine process component in which a photoresist film is formed by the electrodeposition coating method and thereafter the film is subjected to exposure, development, etching, and the like.

BACKGROUND ART

Conventionally, a photo-etching method has been used to produce a precision fine process component utilizing a photoresist. The detail of the method is disclosed in "Illustrated Explanation of Photo-fabrication" written by Takao Hashimoto (Issued by Sougou Denshi Shuppan on Jul. 10, 1986).

In forming, for example, a wiring pattern on a printed wiring board, the pattern is formed by forming a photoresist film on a metal material such as a copper-clad laminate, exposing the laminate with a pattern mask superimposed on the laminate, dissolving the unexposed portion with a developing solution, and further etching the exposed portion of metal with a metal etching solution. As the aforementioned resist film forming method, there can be enumerated (i) a method of laminating a film having a photoresist layer, (ii) a method of coating a liquid-like photoresist by dip coating, roll coating, curtain coating, or the like, and (iii) a method of forming a photoresist layer by electrodeposition coating.

The above-mentioned (iii) method of electrodeposition coating has drawn attention for the reasons of (a) good adhesion to the base material, (b) good followability to the surface unevenness, and (c) capability of processing hole inner surfaces of a board provided with through holes, and the like, and therefore the method has been increasingly put into practice in recent years.

In the electrodeposition coating process of a printed wiring board, there has been conventionally used the method of immersing printed wiring boards in an electrodepositing solution while suspending the boards in the solution in a manner as shown in FIG. 3, flowing an electric current, pulling up the board, cleansing the board with water, and removing the remaining moisture component in the formed film of the printed wiring boards 20, . . . , 20 in a heating dryer 21 while simultaneously heat-fusing the film to complete film formation. According to the recent trend of the increase in wiring density and fineness of printed wiring boards, there has been a growing demand for coping with finer circuits and thinner boards.

However, according to the conventional resist film drying method, there have been (1) the problem that a time of 5 to 10 minutes is required for the sufficient drying by heating and a dark reaction in the unexposed portion progresses during this time to result in a limited resolution after development to consequently fail in forming a fine circuit pattern, and (2) the problem that a thin board has insufficient rigidity to cause the boards in the drying heater to be put in contact with each other to result in damaging the resist.

The inventors of the present invention have conducted intensive research and study to resolve the aforementioned problems, and discovered the fact that satisfactory removal of moisture component and film formation by heating for a shorter time period can be achieved by roll-pressing the resist film after the electrodeposition coating process by means of pressure rolls with heat applied to allow formation of a resist film having a resolution much finer than that of the conventional method and further allow easy drying of a thin board.

Accordingly, the object of the present invention is to solve the aforementioned problems and provide a method for producing a photoresist film for use in producing a precision fine process component capable of achieving removal of moisture component and film formation by heating in a short time, forming a resist film having a resolution much finer than that of the conventional method, and easily drying a thin board.

DISCLOSURE OF INVENTION

In order to achieve the aforementioned objective, the present invention is constructed so that the resist film obtained through the electrodeposition coating process is roll-pressed by pressure rolls with heat applied to the resist film.

In more detail, in a precision fine process component producing process in which a photoresist film is formed on a conductive material by the electrodeposition coating method, there is included a process of drying and heat-fusing the resist film obtained through the electrodeposition coating process by roll-pressing the resist film by means of pressure rolls with heat applied to the resist film.

The aforementioned construction may include a process of drying and heat-fusing the resist film obtained through the electrodeposition coating process while laminating a cover film by means of the pressure rolls with heat applied to the resist film.

In the aforementioned construction, the precision fine process component can be a printed wiring board.

BRIEF DESCRIPTION OF DRAWINGS

These and other objects and features of the present invention will become apparent from the following description taken in conjunction with the preferred embodiments thereof with reference to the accompanying drawings, in which.

BEST MODE FOR CARRYING OUT THE INVENTION

Figure 1:
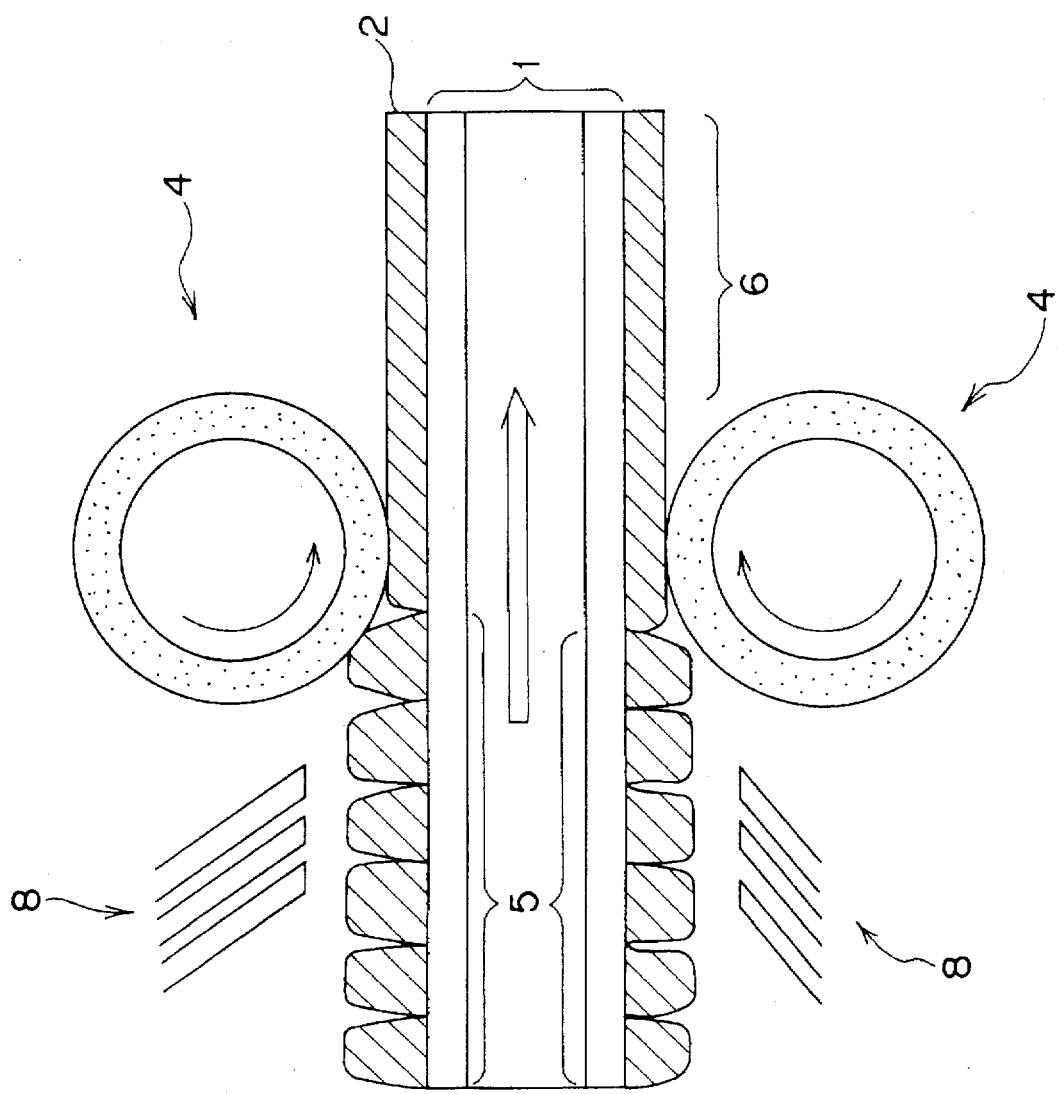
FIG. 1 is a schematic diagram of an apparatus for implementing a method for producing a photoresist film for use in producing a precision fine process component in accordance with an embodiment of the present invention.

It should be noted before describing the present invention that same parts in the attached drawings are denoted by same reference numerals in the following description.

Figure 2:
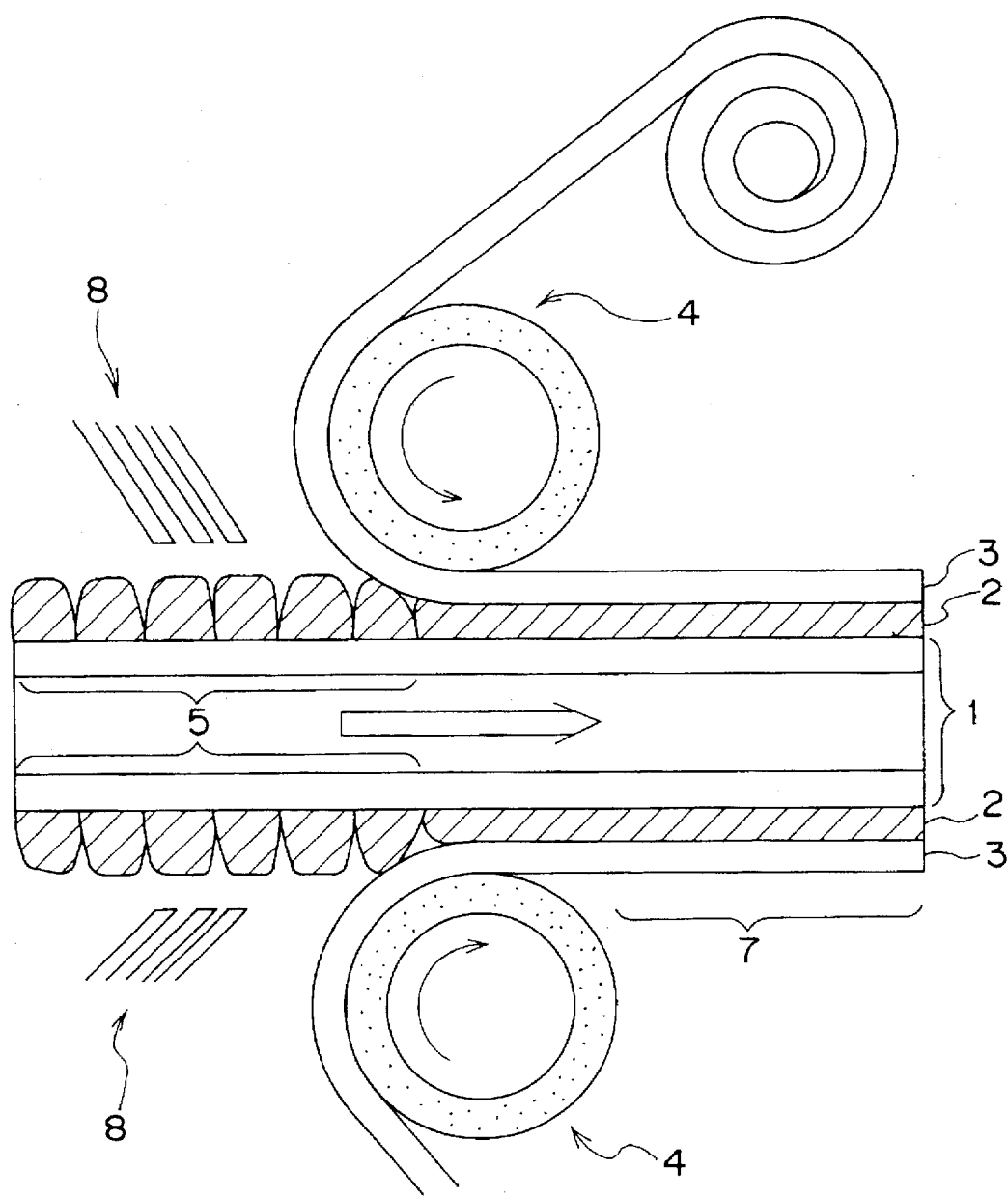
FIG. 2 is a schematic diagram of an apparatus for implementing a production method in accordance with another embodiment of the present invention.
Figure 3:
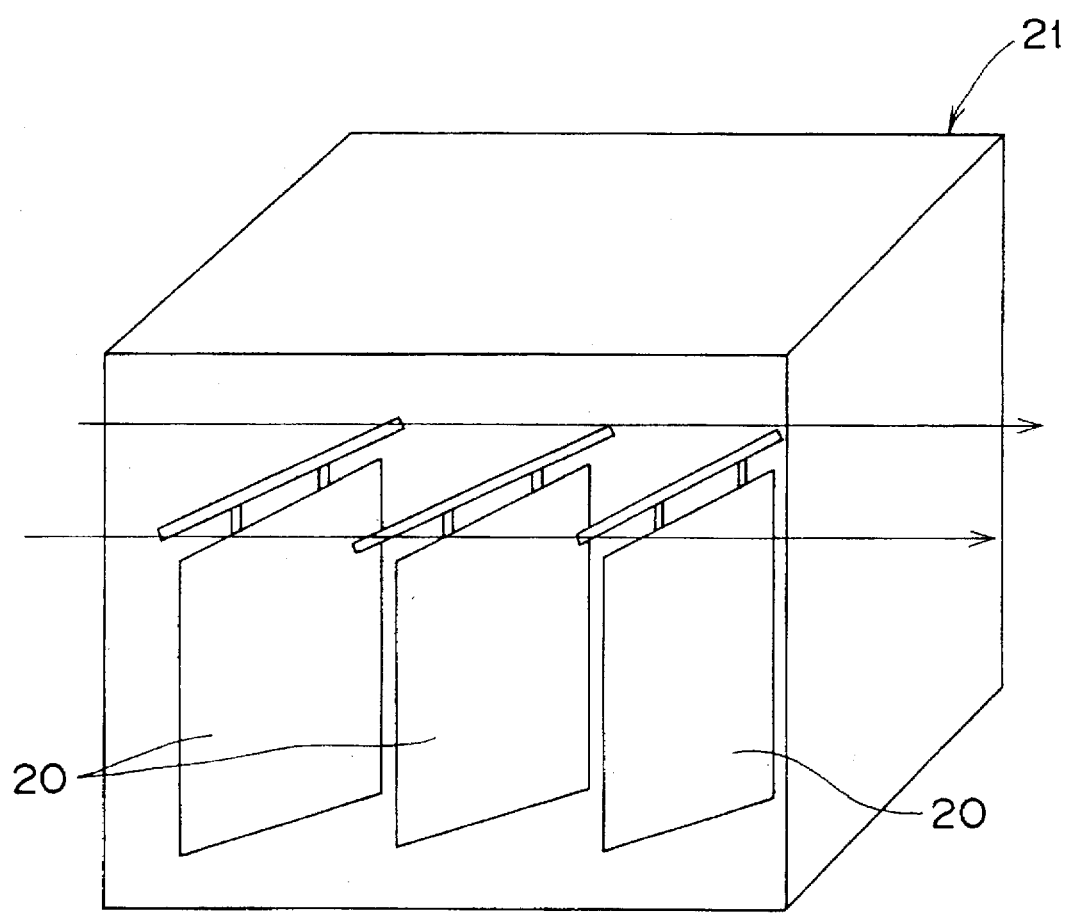
FIG. 3 is a schematic diagram of a conventional apparatus.

The following describes in detail embodiments of the present invention with reference to FIGS. 1 and 2.

FIG. 1 shows an apparatus for implementing a process for producing a photoresist film for use in producing a precision fine process component in accordance with the present embodiment.

In FIG. 1, reference numeral 1 denotes a double-sided copper-clad laminate taken as an example of a conductive material such as metal, 2 a photoresist film, 4 denotes a pair of pressure rolls, 5 a porous resist film region obtained through electrodeposition or cleansing with water, 6 a continuous resist film region obtained through roll-press drying, and 8 air blowers placed against upper and lower surfaces of the laminate 1 ahead of the roll-pressing position of the rolls 4.

In electrodepositing the photoresist film 2 onto the laminate 1 according to the production method of the above-mentioned embodiment, the photoresist film 2 obtained through the electrodeposition coating process is roll-pressed by the rolls 4 with heat applied to the resist film 2.

The "photoresist" herein is a water-dispersion liquid photosensitive resist which is capable of being electrodeposited and capable of producing a precision fine process component such as a printed wiring board after the electrodeposition coating process via the processes of drying by heating, exposure, development, and etching.

Generally, photoresists capable of being electrodeposited include an anion type which is electrodeposited on the anode and a cation type which is electrodeposited on the cathode. In another aspect, photoresists include a negative type of which unexposed portion is dissolved in the developing stage and a positive type of which exposed portion is dissolved in the developing stage. The present embodiment can employ any combination of resists of the above-mentioned types.

Regarding the composition of the photoresist solution, many proposals have been made such as Japanese Laid-Open Patent Publications Nos. 3-177586 and 2-42446. Normally, the photoresist solution is a water-dispersion body having as its principal ingredients photopolymerization type polymer, oligomer, or monomer having a radical reactive functional group such as vinyl group, and a photopolymerization initiator.

The conductive material is allowed to be a conductor capable of being electrodeposited. As the conductive material, there can be enumerated metal such as copper, aluminum, and iron, alloys thereof, oxides thereof, conductive organic materials, and materials obtained by processing an insulating material to make it conductive.

The electrodeposition coating is effected after immersing a board to be subjected to electrodeposition in the photoresist solution to form the resist film 2 on the board by flowing an electric current. Generally, since the electrodeposited film has a porous film construction immediately after the flow of electric current (refer to the region 5 in FIG. 1), it is necessary to make the film continuous by heating before using the film as a resist (refer to the region 6 in FIG. 1). Furthermore, since the resist solution that is adhered to the film when the board is pulled up from the solution has an ingredient different from that of the film formed by the electrodeposition, it is preferred to cleanse the board with water to remove the resist solution adhered to the film in order to form a uniform film.

The roll-pressing by means of the pressure rolls with application of heat is a method for making the board pass through a space between the rolls 4 made of a metal material coated with a resin on condition of specified heat application, pressure application, and feeding speed.

According to such a roll-press drying method, the volatile component such as moisture component can be efficiently removed from the resist film 2 formed in the electrodeposition process, and the resist film 2 can be instantaneously fused to change the porous film into the continuous film (refer to the change from the region 5 to the region 6 in FIG. 1). Therefore, by using the production method of the present embodiment, the time required for drying can be remarkably reduced, and drying of a thin board having a thickness of not greater than 0.4 mm, which has been considered to be impossible, can be achieved.

More surprisingly, it is found that the resist formed by the roll-press drying method has a resolution much higher than that of the conventional oven drying method. Although the reason for the above fact is not yet clear, it is presumed that the formation of a continuous film through fusion of the film by heating achieved in a short time eliminates the dark reaction of the photoresist due to heat, which has been conventionally promoted due to a long-time drying by heating, and consequently improves the developability to increase the resolution.

The rolls 4 used for the roll-press drying method are desired to be resin-coated rolls in terms of making the pressure force constant and preventing the possible pickup of the resist film 2 by the rolls 4 (transfer of the resist film to the rolls). The resin to be coated on the rolls is preferably an elastic material having a JIS hardness (JIS K6301: Spring system hardness test type A) ("JIS" herein means Japanese Industrial Standards.) of 10 to 100 having a heat resistance to the operational heat temperature. When the hardness of the resin is greater than the above-mentioned range, a constant pressure can be hardly obtained which results in failing to uniformly achieve drying. A resin having a lower hardness exhibits significant cracks and serious wearing to be sometimes unable to be subjected to repetitive use. As a usable material, there can be enumerated, for example, fluororubber, silicone rubber, and urethane rubber. It is of course effective to conduct release processing (e.g., processing with fluororesin), release material coating (e.g., release agent, surface-active agent), or the like in terms of preventing the rolls from picking up the resist film.

The pressure in the roll-pressing stage is 0.2 to 10 kg/cm$^2$ (preferably 1 to 5 kg/cm$^2$). When the pressure is too high, the pickup of the resist film 2 may occur. When the pressure is too low, the pressure becomes inconstant. As a method for heating the rolls 4, there can be utilized a method of integrating an infrared or far infrared heater into each roll, a method of integrating a resistor heater into each roll, a method of circulating a heat transfer medium, a method of arranging a heating air blower just ahead of the rolls 4 to heat the laminate 1 to a specified temperature without providing any heat source in the rolls 4 themselves, or the like.

The roll temperature in the roll-pressing stage is 60° to 200° C. (preferably 100° to 160° C.). When the roll temperature is lower than the above-mentioned temperature range, the fusing of the resist is insufficient to form a continuous film. When the roll temperature is higher than the above-mentioned temperature range, the resist incurs a dark reaction due to heat to result in reducing the resolution and insufficiently removing the volatile component to generate air bubbles in the film. The roll pass speed is required to be set within the condition where no air bubble generation occurs and sufficient drying can be achieved, and it is preferred that the speed be generally 0.1 to 10 m/min., and more preferably 0.5 to 2 m/min.

When the drying is insufficient by means of the pressure rolls with application of heat, it is effective to preliminarily remove the volatile component in the film by means of an air blow 8 having a room temperature to a temperature of about 120° C. immediately before the pressing stage.

In such a case, it is preferred to reduce the volatile component to at least not greater than 10% (in a ratio by weight with respect to the film). When the air blow temperature is too high, the resist incurs a dark reaction, which is not preferable. Particularly in the case of a board with through holes, it is preferred to concurrently use a heating air blower having a temperature of 80° to 120° C. for the reason that the resist inside the through holes is required to be dried.

According to the above-mentioned embodiment, the resist film obtained through the electrodeposition coating process can be dried and formed in a film to allow a high reproducibility and allow easy drying of a thin board having a thickness of not greater than 0.4 mm, which has been conventionally considered to be impossible. Furthermore, since resist film formation can be achieved with a resolution higher than that of the conventional drying method, the present method can sufficiently cope with the increase in wiring density and fineness of printing wiring boards.

It should be noted that the present invention is not limited to the aforementioned embodiment, and the present invention can be implemented in a variety of modes or styles. For instance, according to the production method in accordance with another embodiment of the present invention as shown in FIG. 2, a film type resist laminator (dry film laminator) generally put on the market is used after the electrodeposition resist film formation, and a general inexpensive film material can be laminated as cover films 3 on the upper and lower surfaces of the laminate 1 simultaneously with drying. In FIG. 2, the reference numeral 7 denotes a region of the resist film 2 laminated with the cover film 3.

In another embodiment, there can be utilized as a film material an inexpensive light-transmitting material such as polyethylene, polypropylene, PET, cellophane, nylon, and PVC. By using the above method, a laminate composed of a cover film, a resist, and a board having the same structure as that of a laminate formed by adhering a general film type resist (dry film resist) onto a base material can be produced at low cost. The structure is effective in preventing dust from adhering, preventing damage, and storing laminates in a stack in the time of storage. In use, the cover films 3 must be peeled off before the exposure or development process. As a film material, a light-shielding material such as paper, colored plastic, and metal foil can be utilized. In the above case, the cover films 3 must be peeled off before the exposure process. However, when the laminate is stored as a precision fine process component, there is an advantage that the laminate is not always required to be shielded from light. The above-mentioned embodiment can also produce the same effect as described on the previous embodiment.

The following describes the aforementioned two embodiments based on practical examples.

EXAMPLE 1

Using an electrodepositing solution of a negative type anion electrodeposition resist (photo ED N-100) produced by Nippon Paint Co., Ltd., electrodeposition coating was effected for one minute on a 0.2-mm thick double-sided copper-clad laminate (180×250 mm) which served as an anode by means of a constant-current DC power source of 50-mA/dm$^2$ at a solution temperature of 25° C. Then the coated film was cleansed with water and the remaining water on the upper and lower surfaces of the laminate was removed by means of an air blower, and roll-pressing was effected by means of pressure rolls with application of heat in a manner as shown in FIG. 1 to obtain a coated board of which both surfaces were coated with a continuous coating film of even and uniform resist. Then a mask film was closely fit to the board by means of a vacuum apparatus at a room temperature of 25° C., and an ultraviolet ray was applied to both the surfaces by means of an extra-high pressure mercury lamp at a power of 150 mJ/cm$^2$. The exposed board was developed with 1 percent by weight of sodium carbonate, and copper portion is etched by an etching solution having ferric chloride as a main ingredient to obtain a printed wiring board on which a circuit pattern was formed. Circuit pattern formation conditions and roll-press drying conditions are shown in Table 1.

EXAMPLE 2

Using an electrodepositing solution of a positive type anion electrodeposition resist (photo ED P-2000) produced by Nippon Paint Co., Ltd. and a 2-mm thick copper-clad laminate having through holes of 0.4 mm and 0.6 mm in diameter, a printed wiring board provided with through holes was obtained under the same conditions as in Example 1 except that heat air blow was effected at 100° C. just before the roll-pressing as shown in FIG. 1 and that the ultraviolet ray applying condition was 450 mJ/cm$^2$. The obtained results are shown in Table 1.

EXAMPLE 3

A resist-coated board with a cover film was obtained in the same manner as in Example 1 except that the roll-press drying was effected while laminating a 20-μm thick polyethylene terephthalate film (PET film) put on the market by means of an apparatus as shown in FIG. 2. A printed wiring board was obtained under the same conditions as in Example 1 except that a mask film was applied onto the cover film, ultraviolet application was effected, and then development was effected by peeling off the cover film. The obtained results are shown in Table 1.

COMPARATIVE EXAMPLE

A printed wiring board was obtained under the same conditions as in Example 1 except that the drying of the coated board was effectuated in an oven at a temperature of 100° C. for five minutes after the electrodeposition process. The obtained results are shown in Table 1.

When 0.2-mm thick coated boards were employed in the present example of drying and the boards were dried while being suspended at intervals of 5 cm, the coated boards were put in contact with each other to produce a number of scratches on the resist surfaces.

TABLE 1

| | Roll coating material (JIS hardness) | Air blow temperature (°C.) | Roll temperature (°C.) | Roll pressure* condition (kg/cm$^2$) | Roll pass speed (m/min) | Resist film finish condition | ** Resolution |
|---|---|---|---|---|---|---|---|
| Example 1 | Silicone rubber (30) | — | 100 | 1–5 | 0.5 | Good | ○ |
| | " | — | 160 | " | 0.5 | Tiny air bubbles | Δ |
| | " | — | 100 | " | 2 | Partially | Δ |
| | " | 20 | 60 | " | 0.5 | discontinuous Firm | Δ |

TABLE 1-continued

| | Roll coating material (JIS hardness) | Air blow temperature (°C.) | Roll temperature (°C.) | Roll pressure* condition (kg/cm$^2$) | Roll pass speed (m/min) | Resist film finish condition | ** Resolution |
|---|---|---|---|---|---|---|---|
| | " | 20 | 100 | " | 1 | Good | ◯ |
| | " | 120 | 160 | " | 2 | " | ◯ |
| | " | 160 | 140 | " | 1 | " | Δ |
| | " | 20 | 140 | " | 1 | " | ◯ |
| | Fluororubber (70) | 20 | 200 | " | 1 | " | Δ |
| | " | 20 | 140 | " | 1 | " | ◯ |
| | Tetrafluoro-ethylene (100<) | 20 | 140 | 10 or less (Intra-surface nonuniformity) | 1 | Partially picked up | Δ |
| Example 2 | Silicone rubber (30) | 120 | 140 | 1~5 | 1 | Good | ◯ |
| Example 3 | " | 20 | 160 | " | 1 | " | ◯ |
| Comparative example | Hold in oven for 5 min. at 100° C. | | | | | " | x |

*Range of intra-surface pressure in roll-pressing (by means of a pressure-sensitive test paper)
**Condition of line formation obtained through exposure by means of a mask film having line/pitch interval of 50μ/50μ → development → and etching process
◯ = Good, Δ = Copper remaining at a part of pitch portion, x = Copper remaining on the entire surface of pitch portion (resist remaining at pitch portion after development)

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

INDUSTRIAL APPLICABILITY

According to the construction of the present invention, the resist film can be dried in a short time after the electrodeposition, a high productivity can be achieved, and drying of a thin board having a thickness of not greater than 0.4 mm, which has been considered impossible, can be easily achieved. Furthermore, since resist film formation can be achieved with a resolution higher than that of the conventional drying method, the method of the present invention can sufficiently cope with the increase in wiring density and fineness of printing wiring boards.

We claim:

1. A method for producing a photoresist film for use in a process for producing a precision fine process component, which method comprises electrodeposition coating a porous photoresist film on a conductive material, and roll-pressing the resist film on the conductive material by means of a pressure roll with heat applied to the resist film, to dry and instantaneously heat-fuse the resist film and change the resist film from a porous film into a continuous film, the method further comprising a photo-etching step conducted subsequent to the electrodeposition coating.

2. The method as claimed in claim 1, in which drying and heat-fusing the resist film obtained through the electrodeposition coating is conducted while laminating a cover film by means of the pressure roll with heat applied to the resist film.

3. The method as claimed in claim 1, wherein the precision fine process component is a printed wiring board.

4. The method as claimed in claim 2, wherein the precision fine process component is a printed wiring board.

5. The method as claimed in claim 2, wherein the cover film is a light-shielding material.

6. The method as claimed in claim 1, wherein a pressure of 0.2 to 10 kg/cm$^2$ is applied to the pressure roll during roll-pressing.

7. The method as claimed in claim 6, wherein the pressure is 1 to 10 kg/cm$^2$.

8. The method as claimed in claim 7, wherein the pressure is 1 to 5 kg/cm$^2$.

* * * * *